US012785356B2

(12) United States Patent
Nakamura et al.

(10) Patent No.: US 12,785,356 B2
(45) Date of Patent: Nov. 3, 2026

(54) OPTICAL SEMICONDUCTOR DEVICE

(71) Applicant: Mitsubishi Electric Corporation, Tokyo (JP)

(72) Inventors: Koichi Nakamura, Tokyo (JP); Keita Mochizuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 535 days.

(21) Appl. No.: 18/558,278

(22) PCT Filed: Jun. 28, 2021

(86) PCT No.: PCT/JP2021/024280
§ 371 (c)(1),
(2) Date: Oct. 31, 2023

(87) PCT Pub. No.: WO2023/275913
PCT Pub. Date: Jan. 5, 2023

(65) Prior Publication Data
US 2024/0235152 A1 Jul. 11, 2024

(51) Int. Cl.
*H01S 5/026* (2006.01)
*H01S 5/022* (2021.01)
*H01S 5/02325* (2021.01)
*H01S 5/0239* (2021.01)

(52) U.S. Cl.
CPC ............ *H01S 5/0262* (2013.01); *H01S 5/022* (2013.01); *H01S 5/02325* (2021.01); *H01S 5/0239* (2021.01)

(58) Field of Classification Search
CPC .... H01S 5/0262; H01S 5/022; H01S 5/02325; H01S 5/0239
See application file for complete search history.

(56) References Cited

U.S. PATENT DOCUMENTS

2016/0093595 A1* 3/2016 Parsa .................... G01R 33/26 257/82
2016/0294477 A1 10/2016 Mizobuchi et al.
2018/0062756 A1* 3/2018 Ho ....................... H04B 10/572
2020/0303897 A1* 9/2020 Misawa ............. H01S 5/02345

FOREIGN PATENT DOCUMENTS

JP H11218651 A * 8/1999 ....... H01L 2924/151
JP 2016-197635 A 11/2016

OTHER PUBLICATIONS

Machine translation of JPH11218651A (Year: 1999).*
International Search Report issued in PCT/JP2021/024280; mailed Sep. 14, 2021.

* cited by examiner

*Primary Examiner* — Yuanda Zhang
(74) *Attorney, Agent, or Firm* — Studebaker Brackett PLLC

(57) ABSTRACT

An optical semiconductor device comprises a semiconductor laser mounted on a bottom portion of a package, a receiving unit that receives a signal light from an outside using local oscillator light output from the laser, and a receiving-unit-mounted substrate on which the receiving unit including a semiconductor light receiving element is mounted. The receiving unit is disposed on a surface on the side opposite to the laser. The light receiving-unit-mounted substrate is a non-transmissive substrate, has a light passing portion through which the local oscillator light output from the laser passes, and covers the bottom portion surrounded by an outer peripheral portion of the package.

20 Claims, 13 Drawing Sheets

OPTICAL SEMICONDUCTOR DEVICE

TECHNICAL FIELD

The present application relates to an optical semiconductor device.

BACKGROUND ART

Patent Document 1 discloses an optical module that multiplexes optical signals having four different wavelengths and transmits and receives the multiplexed optical signals. The optical module of Patent Document 1 includes an integrated transmit/receive optical assembly in which a semiconductor laser and a semiconductor light receiving element are mounted in one package.

CITATION LIST

Patent Document

Patent Document 1: Japanese Patent Application Laid-Open No. 2016-197635 (FIG. 2)

SUMMARY OF INVENTION

Problems to be Solved by Invention

In an optical semiconductor device in which a semiconductor laser and a semiconductor light receiving element are mounted in one package, the semiconductor laser on a transmitting side and the semiconductor light receiving element on a receiving side are typically disposed in a plane of the same substrate. In the integrated transmit/receive optical assembly of Patent Document 1, the semiconductor laser on the transmitting side and the semiconductor light receiving element on the receiving side are also disposed in a plane of the same substrate. Further, in the integrated transmit/receive optical assembly of Patent Document 1, an optical system on the transmitting side and an optical system on the receiving side are disposed without providing an optical shield such as a wall. In this structure, if stray light occurs, which is caused by the light leaking from the transmitting side to the receiving side, this stray light becomes a noise and may lead to deterioration of the characteristics in the receiving side.

In the integrated transmit/receive optical assembly of Patent Document 1, the transmitting side and the receiving side thereof operate independently. Therefore, in order to prevent the stray light on the transmitting side from leaking to the receiving side, the transmitting side and the receiving side can be formed into independent packages, or a wall for shielding can be provided even in the same package on which both sides are mounted. However, in a recent optical semiconductor device that performs digital coherent optical communication, it is necessary to transmit light (local oscillator light) on the transmitting side to the receiving side at the time of reception, and in a case where a signal light source and a local oscillator light source are shared, it is difficult to make the transmitting side and the receiving side into independent packages. In addition, in a case where the transmitting side and the receiving side are disposed in one package and the signal light source and the local oscillator light source are shared, it is difficult to provide a space for disposing a wall that completely shields stray light between the transmitting side and the receiving side disposed in a horizontal direction in response to a demand for further miniaturization of the package size, and thus it is difficult to dispose the wall.

It is an object of the technology disclosed in the specification of the present application to prevent stray light from the transmitter side to the receiver side while a compact size is maintained, even when the digital coherent optical communication is performed.

Means for Solving Problems

An optical semiconductor device as an example disclosed in the specification of the present application is an optical semiconductor device in which a semiconductor laser that outputs laser light and a semiconductor light receiving element that receives signal light from an outside are mounted on a package and which performs digital coherent optical communication with an outside. The optical semiconductor device includes the semiconductor laser mounted on a bottom portion of the package, a receiving unit to receive the signal light from an outside by using local oscillator light that is the laser light output from the semiconductor laser, and a receiving-unit-mounted substrate on which the receiving unit including the semiconductor light receiving element is mounted. The receiving unit is disposed on a surface thereof opposite to a surface thereof facing the semiconductor laser. The receiving-unit-mounted substrate is a non-transmissive substrate that does not transmit the laser light, includes a light passing portion through which the local oscillator light output by the semiconductor laser passes, and covers the bottom portion surrounded by an outer peripheral portion of the package without a gap or with a gap, relative to the outer peripheral portion. When the receiving-unit-mounted substrate covers the bottom portion surrounded by the outer peripheral portion of the package with the gap relative to the outer peripheral portion, a gap length between the outer peripheral portion of the package and the receiving-unit-mounted substrate is equal to or less than a thickness of the receiving-unit-mounted substrate.

Effect of Invention

In the optical semiconductor device as an example disclosed in the specification of the present application, the semiconductor laser that outputs the laser light is mounted on the bottom portion of the package, and the receiving unit is mounted on the side opposite to the semiconductor laser in the receiving-unit-mounted substrate that covers the bottom portion surrounded by the outer peripheral portion of the package without the gap or with the gap, relative to the outer peripheral portion. Therefore, even in the case when the digital coherent optical communication is performed, the stray light from the transmitting side to the receiving side can be prevented while a compact size is maintained.

MODES FOR CARRYING OUT INVENTION

Embodiment 1

Figure 1:
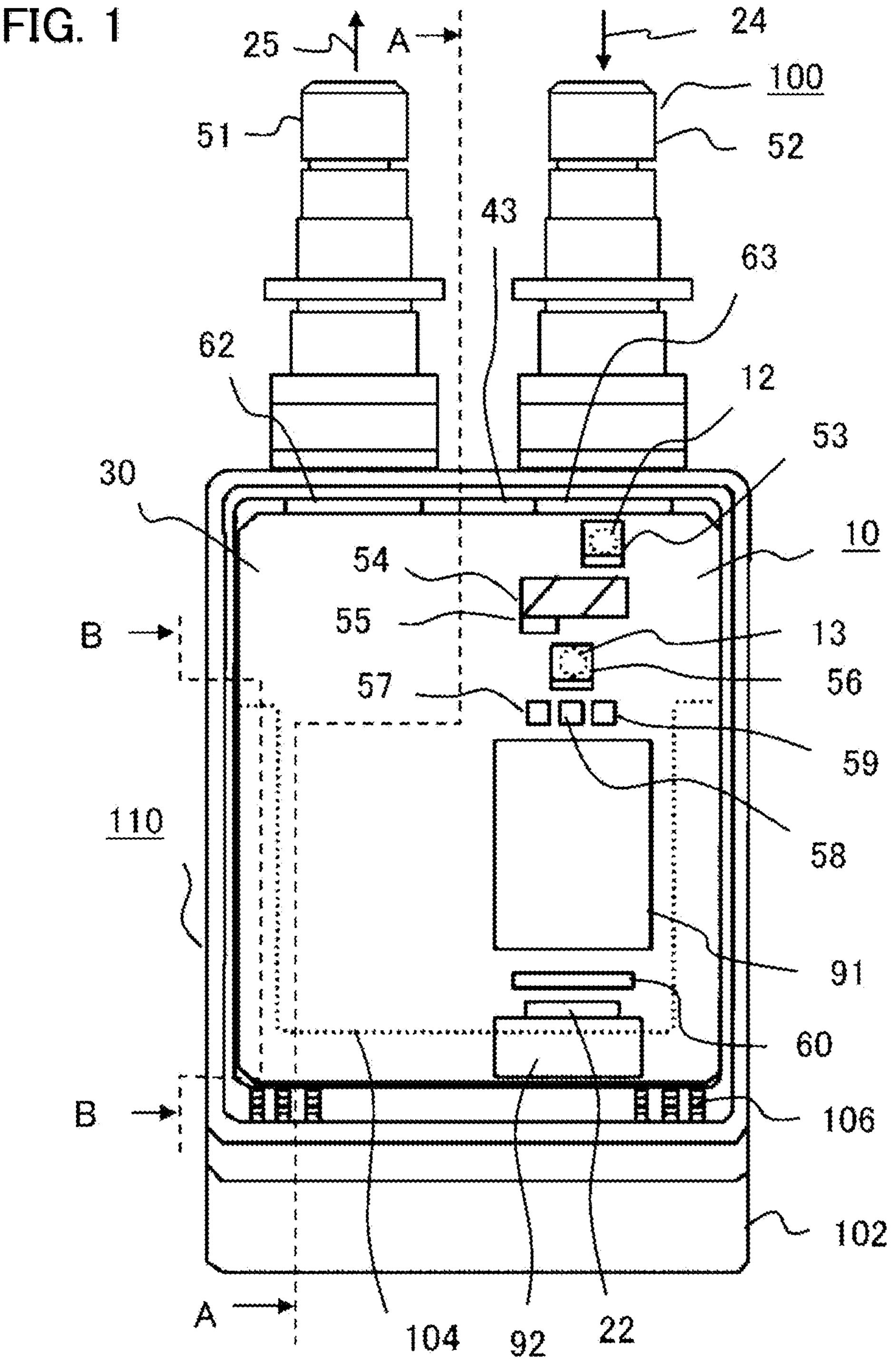
FIG. 1 is a diagram showing an optical semiconductor device according to Embodiment 1.
Figure 2:
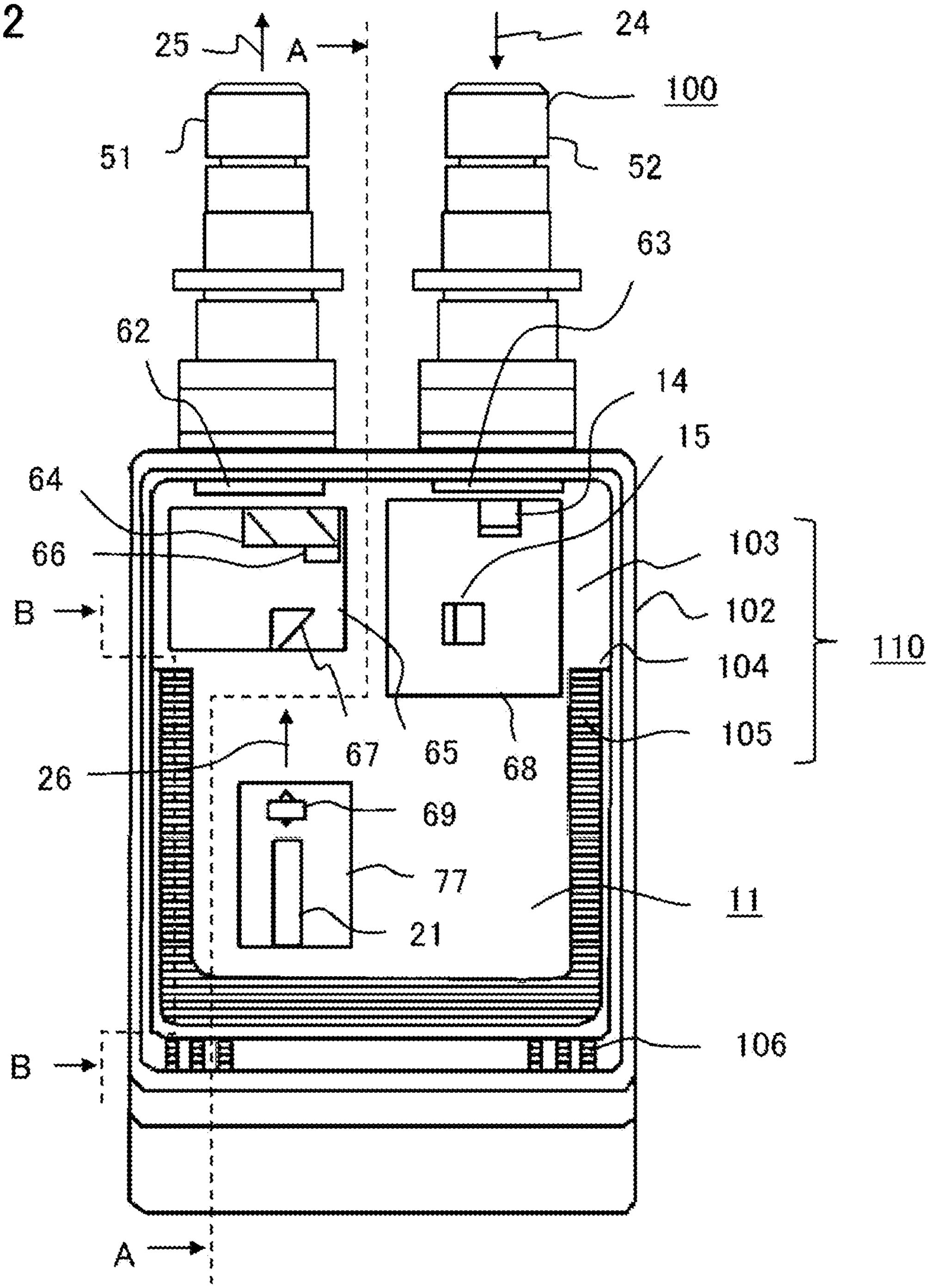
FIG. 2 is a diagram showing a bottom side of a package in the optical semiconductor device according to Embodiment 1.
Figure 3:
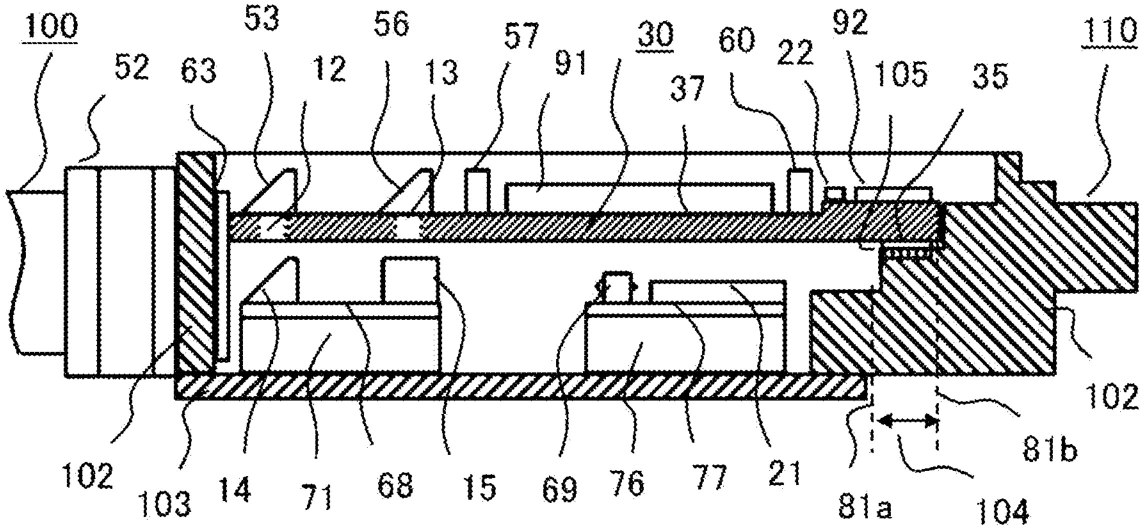
FIG. 3 is a cross-sectional view taken along the broken line indicated by A-A in FIG. 1.
Figure 4:
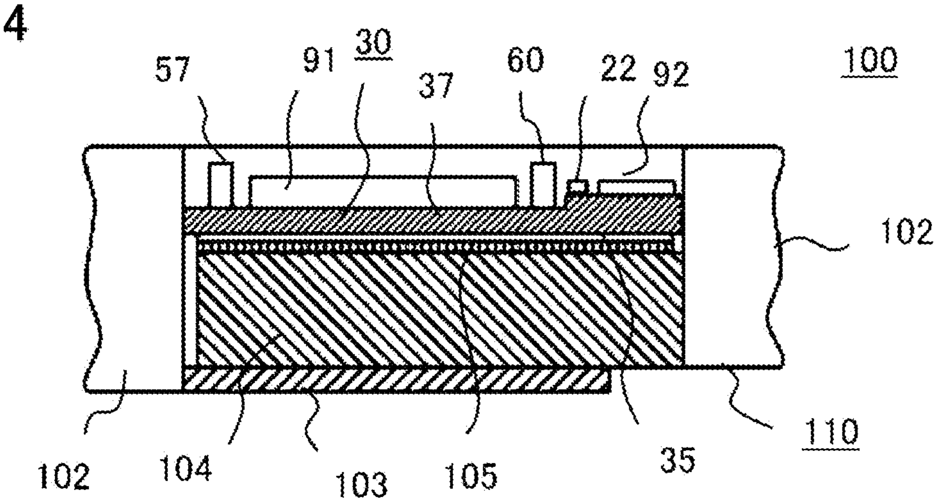
FIG. 4 is a cross-sectional view taken along the broken line indicated by B-B in FIG. 1.
Figure 5:
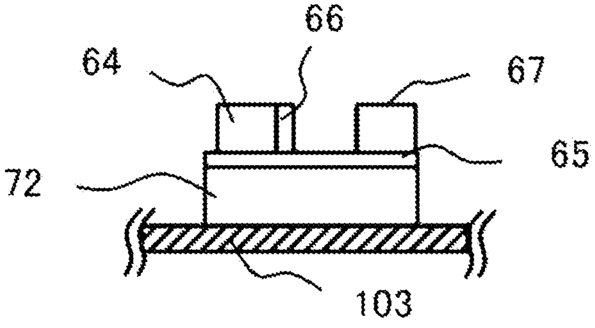
FIG. 5 is a diagram showing a substrate on which prisms through which transmitting light in FIG. 2 passes are disposed and a thermoelectric module.
Figure 6:
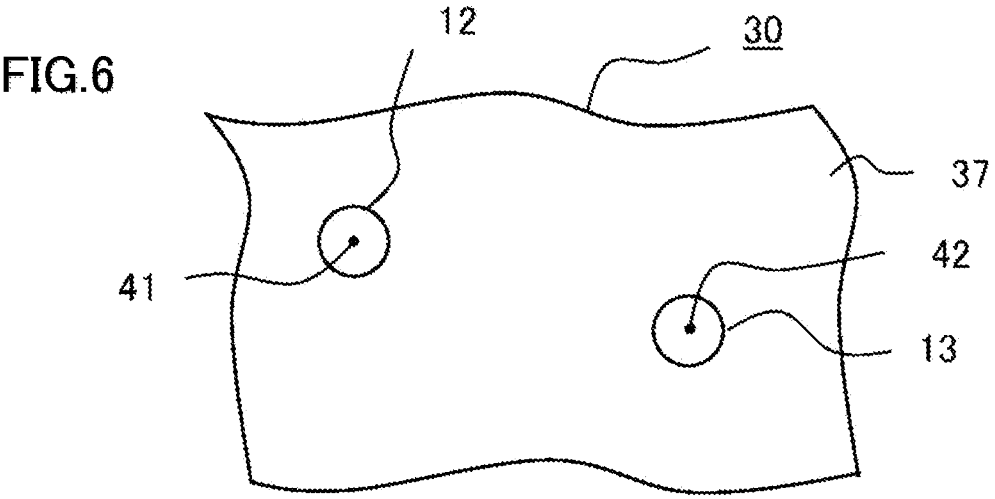
FIG. 6 is a diagram showing a light passing portion in a receiving-unit-mounted substrate of FIG. 1.
Figure 7:
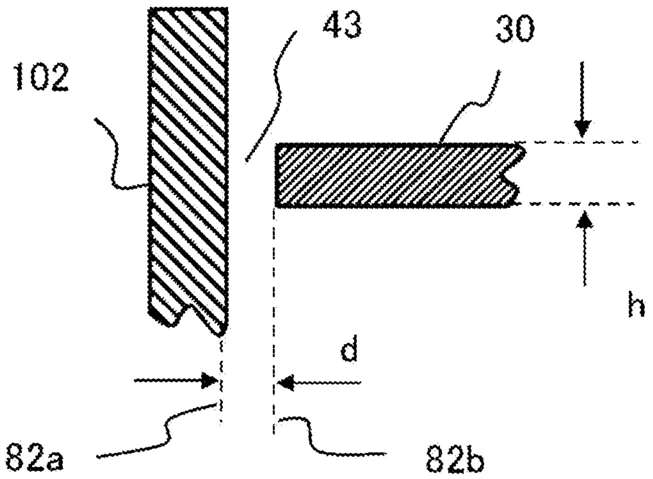
FIG. 7 is a diagram for explaining a gap in FIG. 1.
Figure 8:
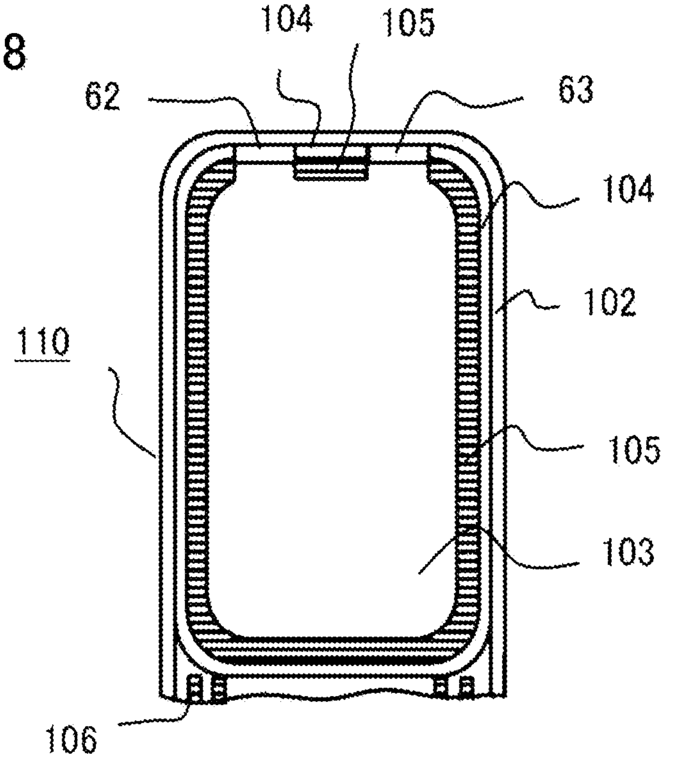
FIG. 8 is a diagram showing another example of a package according to Embodiment 1.
Figure 9:
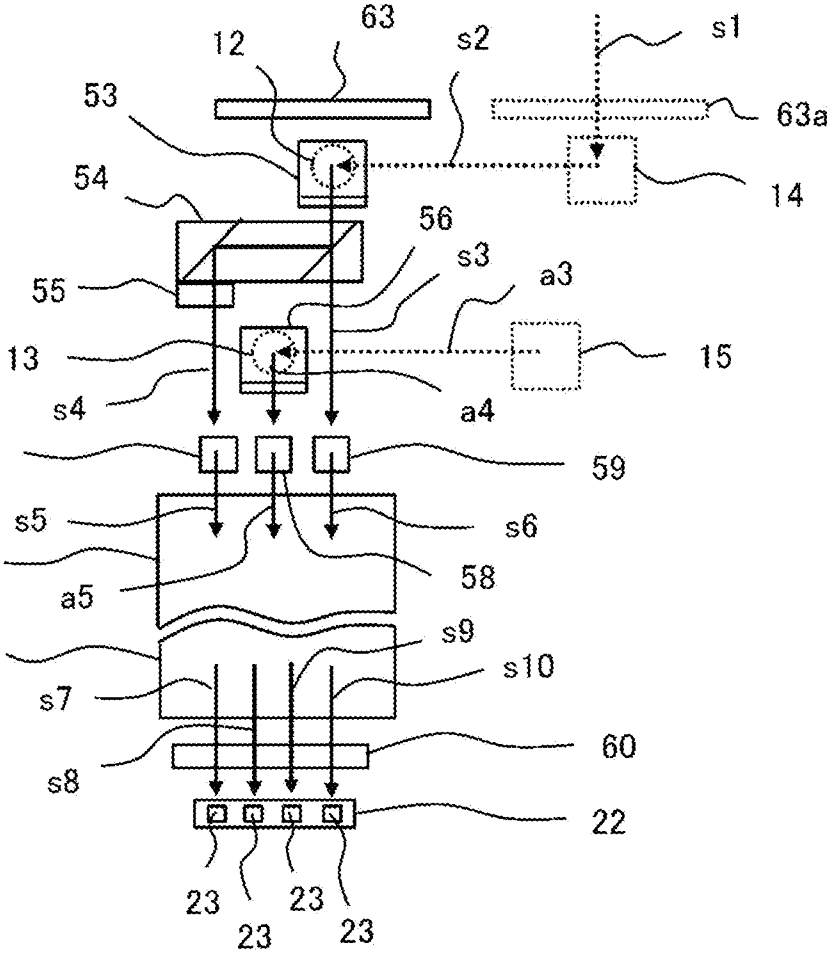
FIG. 9 is a diagram showing a reception path of the optical semiconductor device according to Embodiment 1.
Figure 10:
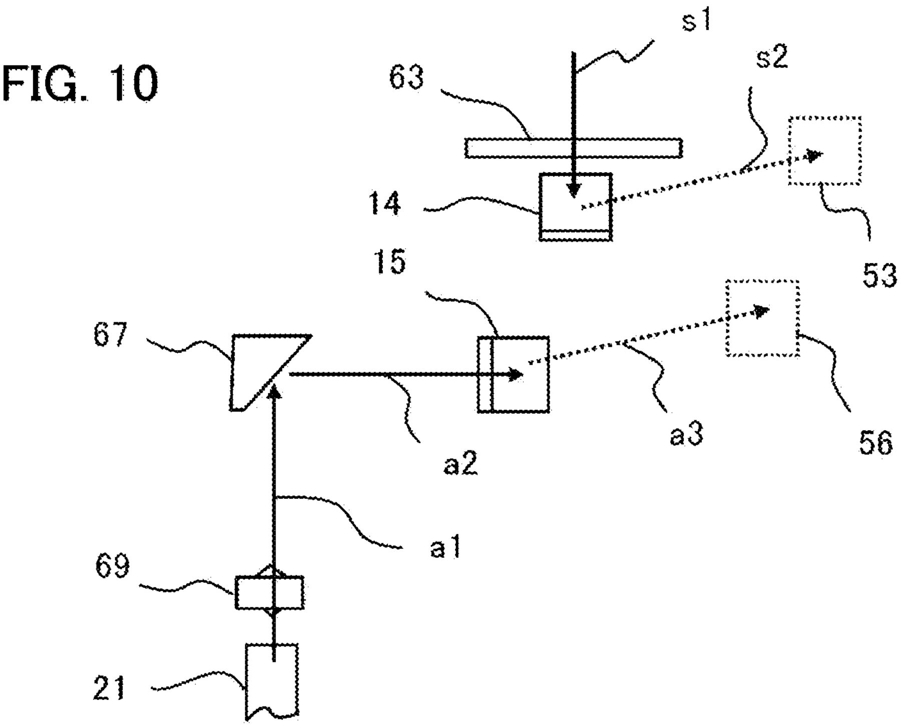
FIG. 10 is a diagram showing a local oscillator light path of the optical semiconductor device according to Embodiment 1.
Figure 11:
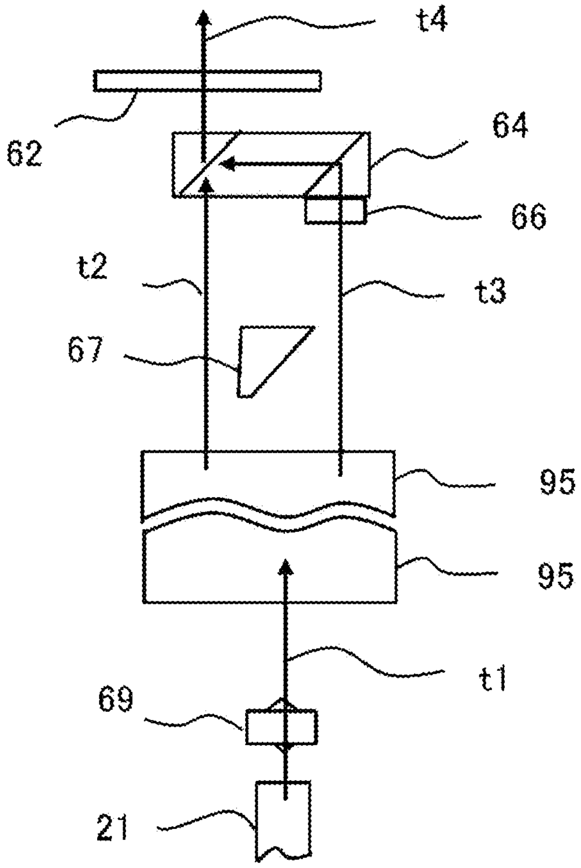
FIG. 11 is a diagram showing a transmission path of the optical semiconductor device according to Embodiment 1.
Figure 12:
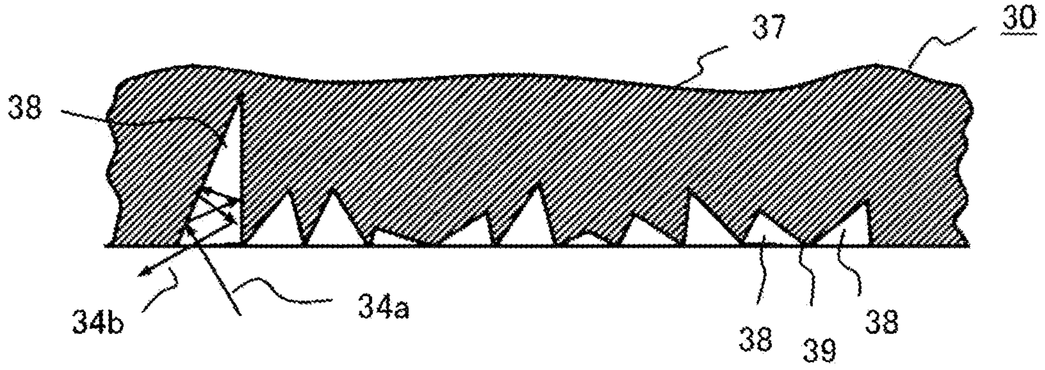
FIG. 12 is a diagram showing another example of the receiving-unit-mounted substrate according to Embodiment 1.
Figure 13:
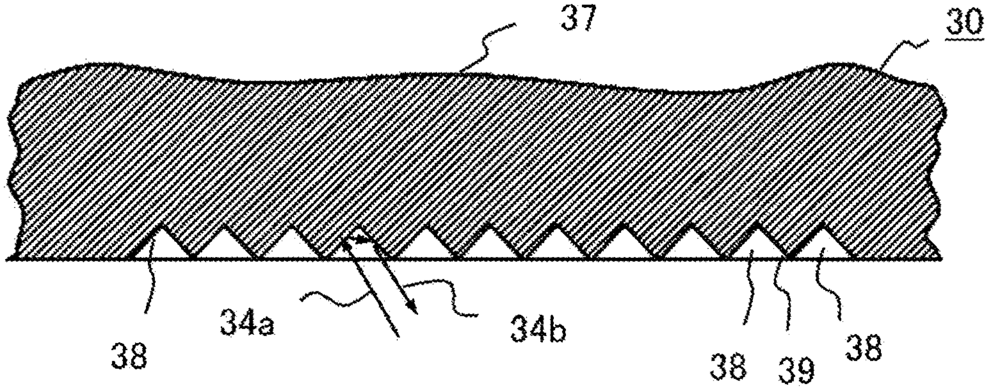
FIG. 13 is a diagram showing another example of the receiving-unit-mounted substrate according to Embodiment 1.

FIG. 1 is a diagram showing an optical semiconductor device according to Embodiment 1, and FIG. 2 is a diagram showing a bottom side of a package in the optical semiconductor device according to Embodiment 1. FIG. 3 is a cross-sectional view taken along the broken line indicated by A-A in FIG. 1, and FIG. 4 is a cross-sectional view taken along the broken line indicated by B-B in FIG. 1. FIG. 5 is a diagram showing a substrate on which prisms through which transmitting light in FIG. 2 passes are disposed, and a thermoelectric module, and FIG. 6 is a diagram showing a light passing portion of a receiving-unit-mounted substrate of FIG. 1. FIG. 7 is a diagram for explaining a gap in FIG. 1, and FIG. 8 is a diagram showing another example of the package according to Embodiment 1. FIG. 9 is a diagram showing a reception path of the optical semiconductor device according to Embodiment 1, and FIG. 10 is a diagram showing a local oscillator light path of the optical semiconductor device according to Embodiment 1. FIG. 11 is a diagram showing a transmission path of the optical semiconductor device according to Embodiment 1. FIG. 12 and FIG. 13 are diagrams showing other examples of the receiving-unit-mounted substrate according to Embodiment 1. The optical semiconductor device 100 includes a package 110, a receptacle 51 for outputting transmitting light 25 to the outside, a receptacle 52 for inputting receiving light 24 as signal light from the outside, a window 62 for passing the transmitting light 25 from the inside of the package 110 to the receptacle 51, a window 63 for passing the receiving light 24 from the receptacle 52 to the inside of the package 110, a receiving unit 10 including a semiconductor light receiving element 22, a receiving-unit-mounted substrate 30 on which the receiving unit 10 is mounted, and a transmitting unit 11 including a semiconductor laser 21 and mounted on a bottom portion 103 of the package 110. Note that the transmitting unit 11 includes components used to receive the signal light in addition to components used to transmit the signal light. However, since the transmitting unit 11 includes the components used to transmit the signal light, all the components mounted on the bottom portion 103 of the package 110 are referred to as the transmitting unit. The receiving unit 10 includes only components used for receiving the signal light.

In the optical semiconductor device 100, the semiconductor laser 21 that outputs laser light and the receiving unit 10 including and the semiconductor light receiving element 22 that receives the receiving light 24 being the signal light from the outside are mounted on the package 110, and digital coherent optical communication with the outside is performed. In the digital coherent optical communication, when the receiving light 24 is received, local oscillator light 26 is used, which is the laser light output from the semiconductor laser 21. In the specification of the present application, an example in which a signal light source that outputs the transmitting light 25, which is the signal light to be transmitted to the outside, and the local oscillator light source that outputs laser light used when the receiving light 24 is to be received are shared will be described.

The receiving unit 10 includes, for example, a prism 53, a polarization multiplexing/de-multiplexing prism 54, a polarization rotation plate 55, a prism 56, three lenses 57, 58, and 59, a 90-degree hybrid 91, a lens 60, the semiconductor light receiving element 22, and an amplifier 92. The transmitting unit 11 includes, for example, three thermoelectric modules 71, 72, and 76, substrates 68, 65, and 77 disposed in the respective thermoelectric modules 71, 72, and 76, the semiconductor laser 21 disposed on the substrate 77, a lens 69, a prism 67 disposed on the substrate 65, a polarization rotation plate 66, a polarization multiplexing/de-multiplexing prism 64, and two prisms 14 and 15 disposed on the substrate 68. The receiving-unit-mounted substrate 30 is a non-transmissive substrate 37 that does not transmit laser light, and a material of the non-transmissive substrate 37 is a substance that does not transmit light, for example, a metal or a ceramic. The receiving-unit-mounted substrate 30 includes a hole 12 that is penetrated, which is a passage through which the receiving light 24 passes, and a hole 13 that is penetrated, which is a passage through which the local oscillator light 26 passes, the local oscillator light being the laser light output by the semiconductor laser 21. The holes 12 and 13 penetrate the surface of the receiving-unit-mounted substrate 30 facing the semiconductor laser 21 and the surface on the opposite side. As appropriate, the surface of the receiving-unit-mounted substrate 30 facing the semiconductor laser 21 is referred to as an inner surface of the receiving-unit-mounted substrate 30, and the surface of the receiving-unit-mounted substrate 30 opposite to the surface facing the semiconductor laser 21 is referred to as an outer surface of the receiving-unit-mounted substrate 30. When the material of the non-transmissive substrate 37, that is, a base material of the substrate is metal, the receiving-unit-mounted substrate 30 is a metal substrate. When the material of the non-transmissive substrate 37, that is, the base material of the substrate is ceramic, the receiving-unit-mounted substrate 30 is a ceramic substrate.

The package 110 includes an outer peripheral portion 102, the bottom portion 103, a substrate disposition portion 104 that is provided to extend to the inside of the outer peripheral portion 102 and on which the receiving-unit-mounted substrate 30 is disposed, a substrate connection pattern 105 made of metal that is formed on the substrate disposition portion 104 and is connected to the receiving-unit-mounted substrate 30 with a conductive connection member 35, and an electrode pattern 106 that is electrically connected to the outside. The substrate disposition portion 104 is formed closer to the bottom portion 103 than an end portion of the outer peripheral portion that is most distant from the bottom portion 103 in the vertical direction of the bottom portion 103, and is formed for the outer peripheral portion 102 to extend to the inside of the package 110 in the horizontal direction perpendicular to the vertical direction of the bottom portion 103. The substrate disposition portion 104 can also be referred to as a part of the outer peripheral portion 102. Semiconductor elements, the thermoelectric modules, and the like in the package 110 are connected to an external device via the electrode pattern 106. The receiving-unit-mounted substrate 30 covers the bottom portion 103 of the package 110 and covers the transmitting unit 11 including the semiconductor laser 21 mounted on the bottom portion 103 of the package 110. The optical semiconductor device 100 according to Embodiment 1 has a three dimensional arrangement structure in which the transmitting unit 11 including the semiconductor laser 21 that outputs laser light and the receiving unit 10 including the semiconductor light receiving element 22 that receives the receiving light 24 being signal light from the outside are disposed with the receiving-unit-mounted substrate 30 interposed therebetween. In the optical semiconductor device 100 according to Embodiment 1, mounting region inside the package 110 can be expanded by the three dimensional arrangement structure. That is, in the optical semiconductor device 100 according to Embodiment 1, the length thereof in the direction perpendicular to the traveling direction of the receiving light 24 and the transmitting light 25 can be reduced, and thus the optical semiconductor device can be made compact. Note that, after the transmitting unit 11 and the receiving unit 10 that is mounted on the receiving-unit-mounted substrate 30 are mounted, the package 110 is connected by a lid (not illustrated) on the surface substantially parallel to the bottom portion 103 in the outer peripheral portion 102 on the side not connected to the bottom portion 103, and the inside thereof is sealed by the lid. Here, the term "substantially parallel" is not limited to "completely parallel" but includes to mean an allowable angular deviation in the meaning.

The prisms 14, 15, 53, 56, and 67 are components that change the traveling direction of light such as the laser light. The polarization multiplexing/de-multiplexing prisms 54 and 64 are prisms that multiplex or de-multiple X-polarized light and Y-polarized light. The polarization rotation plates 55 and 66 are plate-like components that change the direction of polarization. The lenses 57, 58, 59, 60, and 69 are components that reduce the beam diameter of light such as the laser light. The windows 62 and 63 are glass components through which the signal light passes. The substrates 65, 68, and 77 are plate-like components for adjusting the height of components to be mounted. The thermoelectric modules 71, 72, and 76 are temperature adjustment components, and are, for example, Peltier elements. The thermoelectric modules 71, 72, and 76 stably maintain the frequency of the laser light output from the semiconductor laser 21 disposed in the substrates 68, 65, and 77, the characteristics, etc. of the prisms 67, 14, and 15 and other components.

The 90-degree hybrid 91 is a component for combining the signal light and the local oscillator light (reference wave) to obtain an optical output in accordance with the polarization. For example, when the modulation scheme of the signal light is a quadrature phase shift keying (QPSK) scheme, the 90-degree hybrid 91 outputs four pieces of signal light. The semiconductor light receiving element 22 includes four light receiving portions 23 that receive the respective four pieces of signal light output from the 90-degree hybrid 91. The semiconductor light receiving element 22 is, for example, a waveguide type photodiode. The amplifier 92 amplifies four signals output from the semiconductor light receiving element 22.

The receptacles 51 and 52 are disposed on the same side of the outer peripheral portion 102. In FIG. 3, a portion between a broken line 81*a* and a broken line 81*b* is the substrate disposition portion 104 provided in the outer peripheral portion 102 on the side opposite to the receptacles 51 and 52. The substrate disposition portion 104 is also formed inside the outer peripheral portion 102 in the direction perpendicular to the traveling direction of the receiving light 24 and the transmitting light 25, and a cross-sectional view of this portion is shown in FIG. 4. As appropriate, the side of the receptacles 51 and 52 is referred to as a front side, and the side opposite to the receptacles 51 and 52 is referred to as a rear side. In addition, the orientation in FIG. 1 and FIG. 2 is referred to as the front face as appropriate. In FIG. 3, the electrode pattern 106 is omitted, and the holes 12 and 13 are shown in white. FIG. 3 and FIG. 4 show an example in which the bottom portion 103 of the package 110 and the receiving-unit-mounted substrate 30 are substantially parallel to each other.

FIG. 6 shows a main portion including the holes 12 and 13 that are two light passing portions in the front face of the receiving-unit-mounted substrate 30. The left side of FIG. 6 is the front side of the optical semiconductor device 100, and the right side of FIG. 6 is the rear side of the optical semiconductor device 100. The prism 53 is disposed so as to cover the hole 12, and the prism 56 is disposed so as to cover the hole 13. The prism 14 is disposed on the substrate 68 so as to include the central axis of the hole 12, that is, a central axis 41 of the light passing portion on the front side. The prism 15 is disposed on the substrate 68 so as to include the central axis of the hole 13, that is, a central axis 42 of the light passing portion on the rear side relative to the hole 12. The prism 53 and the prism 14 are disposed so as to include the central axis 41. Similarly, the prism 56 and the prism 15 are disposed so as to include the central axis 42.

FIG. 1 shows an example in which there is a gap 43 between the receiving-unit-mounted substrate 30 and the outer peripheral portion 102 of the package 110. The optical semiconductor device 100 shown in FIG. 1 is an example in which the receiving-unit-mounted substrate 30 covers most of the bottom portion 103 surrounded by the outer peripheral portion 102 of the package 110, that is, an example in which the bottom portion 103 surrounded by the outer peripheral portion 102 of the package 110 is covered by the receiving-unit-mounted substrate with the gap 43 with which the transmitting unit 11 and the receiving unit 10 communicate, the gap 43 between the outer peripheral portion 102 and the receiving-unit-mounted substrate. Even in this case, as shown in FIG. 7, a gap length d, which is the length of the gap 43 between the outer peripheral portion 102 of the package 110 and the receiving-unit-mounted substrate 30, should be equal to or less than a substrate thickness h, which is the thickness of the receiving-unit-mounted substrate 30. A broken line 82*a* indicates the position of the inner surface of the outer peripheral portion 102 of the package 110, and a broken line 82*b* indicates the position of the side surface of the receiving-unit-mounted substrate 30 facing the outer peripheral portion 102 of the package 110. In the outer peripheral portion 102 in which the substrate disposition portion 104 is provided, there is no gap 43 with which the transmitting unit 11 and the receiving unit 10 communicate. When the gap length d of the gap 43 is equal to or less than the substrate thickness h, even if the laser light output from the semiconductor laser 21 deviates from the optical path at the time of reception and at the time of transmission, which will be described later, due to components mounted on the bottom portion 103 of the package 110 and stray light is generated, the stray light does not reach the receiving side and disappears because component arrangement in which the stray light directly travels to the gap 43 is not adopted. Therefore, when the receiving-unit-mounted substrate 30 covers most of the bottom portion 103 surrounded by the outer peripheral portion 102 of the package 110, the length (gap length d) of the gap 43 between the outer peripheral portion 102 of the package 110 and the receiving-unit-mounted substrate 30 should be equal to or less than the thickness (substrate thickness h) of the receiving-unit-mounted substrate 30.

Another example of the package 110 shown in FIG. 8 is an example in which the substrate disposition portion 104 is provided in a portion where the windows 62 and 63 are not disposed inside the outer peripheral portion 102 of the package 110. The optical semiconductor device 100 provided with another example of the package 110 shown in FIG. 8 is an example in which the receiving-unit-mounted substrate 30 covers the entire bottom portion 103 surrounded by the outer peripheral portion 102 of the package 110, that is, an example in which the bottom portion 103 surrounded by the outer peripheral portion 102 of the package 110 is covered by the receiving-unit-mounted substrate without the gap 43 with which the transmitting unit 11 and the receiving unit 10 communicate, the gap 43 being between the outer peripheral portion 102 and the receiving-unit-mounted substrate. In this case, since there is no gap 43 between the outer peripheral portion 102 of the package 110 and the receiving-unit-mounted substrate 30, it is possible to increase the degree of freedom of the arrangement of components mounted on the bottom portion 103 of the package 110.

An optical path at the time of reception and an optical path at the time of transmission will be described with reference to FIG. 9 to FIG. 11. FIG. 9 shows a reception path of the receiving unit 10. In FIG. 9, the prisms 14 and 15 mounted on the bottom portion 103 of the package 110 are indicated with broken lines, and the window 63 at a position facing the prisms 14 and 15 is also indicated as a window 63*a* with a broken line. FIG. 10 shows a reception path of the receiving light 24 and an optical path of the local oscillator light 26 used at the time of the reception in the transmitting unit 11 mounted on the bottom portion 103 of the package 110. Note that in FIG. 10, the prisms 53 and 56 mounted on the receiving-unit-mounted substrate 30 are indicated with broken lines. FIG. 11 shows a transmission path of the transmitting unit 11 mounted on the bottom portion 103 of the package 110.

The receiving light 24 passes through the window 63 and enters the prism 14 as indicated by an optical path s1. The receiving light 24 is reflected by the prism 14 to the hole 12 side of the receiving-unit-mounted substrate 30, passes through the hole 12, and enters the prism 53 as indicated by an optical path s2. Thereafter, a part of the receiving light 24, for example, X-polarized signal light passes through the polarization multiplexing/de-multiplexing prism 54 and enters the lens 59 as indicated by an optical path s3. A part of the receiving light 24, for example, Y-polarized signal light is separated by the polarization multiplexing/de-multiplexing prism 54 as indicated by an optical path s4, passes through the polarization rotation plate 55, and enters the lens 57.

The local oscillator light 26, which is the laser light output from the semiconductor laser 21, passes through the lens 69 and enters the prism 67 as indicated by an optical path a1. The local oscillator light 26 is reflected by the prism 67 and enters the prism 15 as indicated by an optical path a2. The local oscillator light 26 is reflected by the prism 15 to the hole 13 side of the receiving-unit-mounted substrate 30, passes through the hole 13, and enters the prism 56 as indicated by an optical path a3. Thereafter, the local oscillator light 26 enters the lens 58 as indicated by an optical path a4, and the X-polarized signal light of the receiving light 24 enters the 90-degree hybrid 91 through the lens 59 as indicated by an optical path s6. The Y-polarized signal light of the receiving light 24 enters the 90-degree hybrid 91 through the lens 57 as indicated by an optical path s5. The local oscillator light 26 enters the 90-degree hybrid 91 through the lens 58 as indicated by an optical path a5.

The 90-degree hybrid 91 outputs signal light XI of an in-phase component and signal light XQ of a quadrature component in the X-polarized light of the receiving light 24 on the basis of the X-polarized signal light of the receiving light 24 and the local oscillator light 26. The in-phase signal light XI and the quadrature signal light XQ in the X-polarized wave of the receiving light 24 pass through the lens 60 and enter two of the light receiving portions 23 of the semiconductor light receiving element 22 as respectively indicated by optical paths s10 and s9. Further, the 90-degree hybrid 91 outputs the signal light YI of the in-phase component and the signal light YQ of the quadrature component in the Y-polarized light of the receiving light 24 on the basis of the signal light of the Y-polarized light of the receiving light 24 and the local oscillator light 26. The signal light YI of the in-phase component and the signal light YQ of the quadrature-phase component in the Y-polarized light of the receiving light 24 pass through the lens 60 and enter two of the light receiving portions 23 of the semiconductor light receiving element 22 as respectively indicated by optical paths s8 and s7. The four light receiving portions 23 shown in FIG. 9 are referred to as a first light receiving portion, a second light receiving portion, a third light receiving portion, and a fourth light receiving portion in order from the right. The first light receiving portion 23 receives the signal light XI of the receiving light 24, and the second light receiving portion 23 receives the signal light XQ of the receiving light 24. The third light receiving unit 23 receives the signal light YI of the receiving light 24, and the fourth light receiving unit 23 receives the signal light YQ of the receiving light 24.

When the optical semiconductor device 100 outputs the transmitting light 25, the semiconductor laser 21 outputs signal light that is laser light before modulation. The unmodulated signal light output from the semiconductor laser 21 passes through the lens 69 as indicated by an optical path t1 and enters a laser light processing part 95. For example, when the modulation scheme of the signal light is the QPSK scheme, the laser light processing part 95 outputs a signal light TX for the X-polarized light and a signal light TY for the Y-polarized light that are modulated on the basis of four modulation signals TXI, TXQ, TYI, and TYQ. The signal light TX for the X-polarized light enters the polarization multiplexing/de-multiplexing prism 64 as indicated by an optical path t2. The signal light TY for the Y-polarized light passes through the polarization rotation plate 66 and enters the polarization multiplexing/de-multiplexing prism 64 as indicated by an optical path t3. As indicated by an optical path t4, the transmitting light 25 in which the signal light TX and the signal light TY are multiplexed by the polarization multiplexing/de-multiplexing prism 64 passes through the window 62 and is output to the outside from the receptacle 51. In the polarization multiplexing/de-multiplexing prism 64, the signal light TX for the X-polarized light and the signal light TY for the Y-polarized light are multiplexed.

Note that, in FIG. 1, FIG. 3, and FIG. 10, the laser light processing part 95 that outputs two pieces of signal light to be multiplexed as the transmitting light 25 is omitted. The laser light processing part 95 may include, for example, a waveguide through which the local oscillator light 26 passes. In this case, the local oscillator light 26 that passes through the waveguide of the laser light processing part 95 enters the prism 67.

Even if the laser light output from the semiconductor laser is reflected by a component of the transmitting unit 11 and light in a path different from the optical paths a1, a2, a3, t1, t2, and t3, that is, stray light is generated, the receiving-unit-mounted substrate 30 serves as a physical shield. Therefore, in the optical semiconductor device 100 according to Embodiment 1, since the stray light is reflected by the receiving-unit-mounted substrate 30, the stray light does not leak to the receiving unit 10 on the side opposite to the transmitting unit 11 with the receiving-unit-mounted substrate 30 interposed therebetween, and it is possible to prevent the deterioration of the optical characteristics of the receiving light 24.

As described above, in the integrated transmit/receive optical assembly of Patent Document 1, since the semiconductor laser on the transmitting side and the semiconductor light-receiving element on the receiving side are mounted in the same plane of the same substrate, electrical noise leaking from a high-frequency signal such as a modulation signal on the transmitting side reaches the receiving side, which may lead to deterioration in the characteristics. In contrast, in the optical semiconductor device 100 according to Embodiment 1, since the transmitting unit 11 including the semiconductor laser 21 and the receiving unit 10 including the semiconductor light receiving element 22 are disposed with the receiving-unit-mounted substrate 30 interposed therebetween, it is possible to prevent the electric noise from the side of the transmitting unit 11 from leaking to the side of the receiving unit 10 by the receiving-unit-mounted substrate 30. In the case where the receiving-unit-mounted substrate 30 is a metal substrate, the effect of preventing the leakage of electrical noise to the side of the receiving unit 10 can be enhanced as compared with the case where the receiving-unit-mounted substrate 30 is a ceramic substrate. Note that, since the semiconductor light receiving element 22 and the amplifier 92 each are formed on an insulating substrate, the semiconductor light receiving element 22 and the amplifier 92 can operate even when mounted on the receiving-unit-mounted substrate 30 that is a metal substrate. Note that, if the semiconductor light receiving element 22 and the amplifier 92 each are not formed on an insulating substrate, an insulating substrate made of alumina, aluminum nitride, or the like is to be interposed between them and the receiving-unit-mounted substrate 30 that is a metal substrate.

In the integrated transmit/receive optical assembly of Patent Document 1, when a wall is disposed between the transmitting side and the receiving side, it is necessary to provide a gap between the lid and the wall in order to prevent interference between the package and the lid that seals the package. Since the gap formed between the lid and the wall is elongated in the longitudinal direction of the package, that is, in the direction parallel to the transmitting light and the receiving light, stray light is likely to leak from the gap between the transmitting side and the receiving side disposed in the horizontal direction perpendicular to the longitudinal direction as a structure. In contrast, in the optical semiconductor device 100 according to Embodiment 1, the transmitting unit 11 including the semiconductor laser 21 and the receiving unit 10 including the semiconductor light receiving element 22 are disposed with the receiving-unit-mounted substrate 30 interposed therebetween, and thus it is possible to prevent the stray light from the transmitting side to the receiving side. In the optical semiconductor device 100 of Embodiment 1, even if there is a slight gap 43 between the receiving-unit-mounted substrate 30 and the outer peripheral portion 102 of the package 110, since the component arrangement in which stray light directly travels between the receiving-unit-mounted substrate 30 and the outer peripheral portion 102 of the package 110 is not adopted, even if stray light is generated, the stray light does not reach the receiving side and disappears.

The surface of the receiving-unit-mounted substrate 30 facing the semiconductor laser 21 is not limited to a flat surface, and the surface facing the semiconductor laser 21 may include a plurality of recesses 38 as shown in FIG. 12 and FIG. 13. Projections 39 are formed between adjacent recesses 38. The recesses 38 shown in FIG. 12 are an example in which the depth and the shape thereof are not uniform, and the recesses 38 shown in FIG. 13 are an example in which the depth and the shape thereof are uniform. When stray light 34*a* is incident on a recess 38 of the receiving-unit-mounted substrate 30, it is multiply reflected in the recess 38, and the attenuated stray light 34*b* is emitted from the recess 38 of the receiving-unit-mounted substrate 30 to the side of the bottom portion 103 of the package 110. As the depth of the recess 38 increases, the number of times of multiple reflections in the recess 38 increases. Therefore, the deeper the recess 38 is, the higher the effect of attenuating the stray light is. The recesses 38 formed in the receiving-unit-mounted substrate 30 can attenuate light having the same frequency as the local oscillator light 26 by the multiple reflections. Therefore, the optical semiconductor device 100 according Embodiment 1 including the receiving-unit-mounted substrate 30 in which the plurality of recesses 38 are formed on the surface facing the semiconductor laser 21 can enhance the effect of preventing the stray light from the transmitting side to the receiving side more than the optical semiconductor device 100 according to Embodiment 1 including the receiving-unit-mounted substrate 30 in which the recesses 38 are not formed on the surface facing the semiconductor laser 21.

As described above, the optical semiconductor device 100 according to Embodiment 1 is an optical semiconductor device in which the semiconductor laser 21 that outputs laser light and the semiconductor light receiving element 22 that receives signal light (receiving light 24) from the outside are mounted on the package 110 and which performs the digital coherent optical communication with the outside. The optical semiconductor device 100 according to Embodiment 1 includes the semiconductor laser 21 mounted on the bottom portion 103 of the package 110, the receiving unit 10 that receives the signal light (receiving light 24) from the outside using the local oscillator light 26 that is the laser light output from the semiconductor laser 21, and the receiving-unit-mounted substrate 30 on which the receiving unit 10 including the semiconductor light receiving element 22 is mounted. The receiving unit 10 is disposed on the surface opposite to the surface facing the semiconductor laser 21. The receiving-unit-mounted substrate 30 is the non-transmissive substrate 37 that does not transmit the laser light, has the light passing portion (hole 13) through which the local oscillator light 26 output by the semiconductor laser 21 passes, and covers the bottom portion 103 surrounded by the outer peripheral portion 102 of the package 110 without the gap 43 or with the gap 43, relative to the outer peripheral portion 102. When the receiving-unit-mounted substrate 30 covers the bottom portion 103 surrounded by the outer peripheral portion 102 of the package 110 with the gap 43 between the receiving-unit-mounted substrate 30 and the outer peripheral portion 102, the length (gap length d) of the gap 43 between the outer peripheral portion 102 of the package 110 and the receiving-unit-mounted substrate 30 is equal to or less than the thickness (substrate thickness h) of the receiving-unit-mounted substrate 30. In the optical semiconductor device 100 according to Embodiment 1 with the configuration, since the semiconductor laser 21 that outputs the laser light is mounted on the bottom portion 103 of the package 110, and the receiving unit 10 is mounted on the side opposite to the semiconductor laser 21 in the receiving-unit-mounted substrate 30, the receiving-unit-mounted substrate 30 covering the bottom portion 103 surrounded by the outer peripheral portion 102 of the package 110 without the gap 43 or with the gap 43, relative to the outer peripheral portion 102. Therefore, even in the case of the digital coherent optical communication, the stray light from the transmitting side to the receiving side can be prevented while a compact size is maintained.

Embodiment 2

Figure 14:
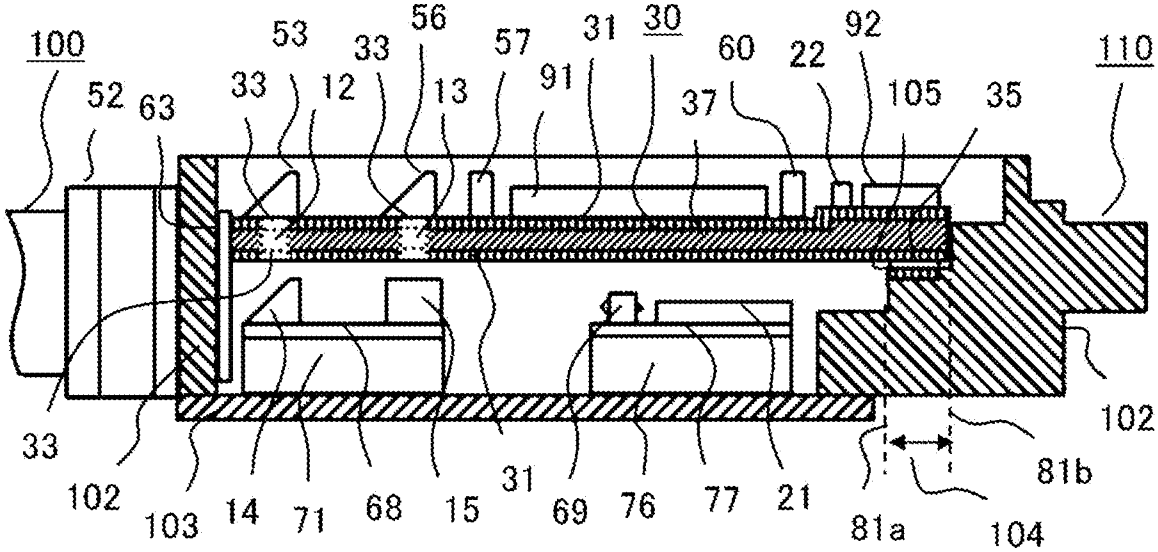
FIG. 14 is a diagram showing an optical semiconductor device according to Embodiment 2.

FIG. 14 is a diagram showing an optical semiconductor device according to Embodiment 2. A cross-sectional view shown in FIG. 14 corresponds to FIG. 3 of Embodiment 1. The optical semiconductor device 100 according to Embodiment 2 is different from the optical semiconductor device 100 according to Embodiment 1 in that a metal plating layer 31 is formed on the surface of the receiving-unit-mounted substrate 30 facing the semiconductor laser 21 and on the surface on the opposite side. Differences from the optical semiconductor device 100 of Embodiment 1 will be mainly described.

The receiving-unit-mounted substrate 30 according to Embodiment 2 includes the non-transmissive substrate 37 and the metal plating layer 31 formed on the inner surface and the outer surface of the non-transmissive substrate 37. In the metal plating layer 31, openings 33 are formed in portions thereof for the holes 12 and 13. The material of the non-transmissive substrate 37 is made of a substance that does not transmit light, for example, metal or ceramic. By passing through the opening 33 on the inner surface of the receiving-unit-mounted substrate 30, the hole 12, and the opening 33 on the outer surface of the receiving-unit-mounted substrate 30, the receiving light 24 is input from the transmitting unit 11 to the receiving unit 10. By passing through the opening 33 on the inner surface of the receiving-unit-mounted substrate 30, the hole 13, and the opening 33 on the outer surface of the receiving-unit-mounted substrate 30, the local oscillator light 26 is input from the transmitting unit 11 to the receiving unit 10. In FIG. 14, the electrode pattern 106 is omitted, and the holes 12 and 13 and the opening 33 are shown in white. In the optical semiconductor device 100 of Embodiment 2, since the metal plating layer 31 is formed on the surface of the receiving-unit-mounted substrate 30 facing the semiconductor laser 21 and on the surface on the opposite side, the effect of preventing electrical noise from the side of the transmitting unit 11 to the side of the receiving unit 10 can be enhanced as compared with the receiving-unit-mounted substrate 30 of a ceramic substrate.

Since the optical semiconductor device 100 according to Embodiment 2 has the same structure as the optical semiconductor device 100 according to Embodiment 1 except that the metal plating layer 31 is formed on the surface of the receiving-unit-mounted substrate 30 facing the semiconductor laser 21 and on the surface on the opposite side, the optical semiconductor device 100 according to Embodiment 2 can prevent the stray light from the transmitting side to the receiving side while being compact even when the digital coherent optical communication is performed as with the optical semiconductor device 100 according to Embodiment 1. In the optical semiconductor device 100 according to Embodiment 2, as with the optical semiconductor device 100 according to Embodiment 1, the stray light is reflected by the receiving-unit-mounted substrate 30, so that the stray light does not leak to the receiving unit 10 on the side opposite to the transmitting unit 11 with the receiving-unit-mounted substrate 30 interposed therebetween, and deterioration of the optical characteristics of the receiving light 24 can be prevented.

Although FIG. 14 shows an example in which the metal plating layer 31 is formed on the surface of the receiving-unit-mounted substrate 30 facing the semiconductor laser 21 and on the surface on the opposite side, the metal plating layer 31 should be formed at least on the surface of the receiving-unit-mounted substrate 30 facing the semiconductor laser 21. The optical semiconductor device 100 according to Embodiment 2 including the receiving-unit-mounted substrate 30 in which the metal plating layer 31 is formed on the inner surface, that is, the surface facing the semiconductor laser 21, also achieves the same effect as the optical semiconductor device 100 according to Embodiment 2 including the receiving-unit-mounted substrate 30 in which the metal plating layer 31 is formed on the inner surface and the outer surface thereof.

Embodiment 3

Figure 15:
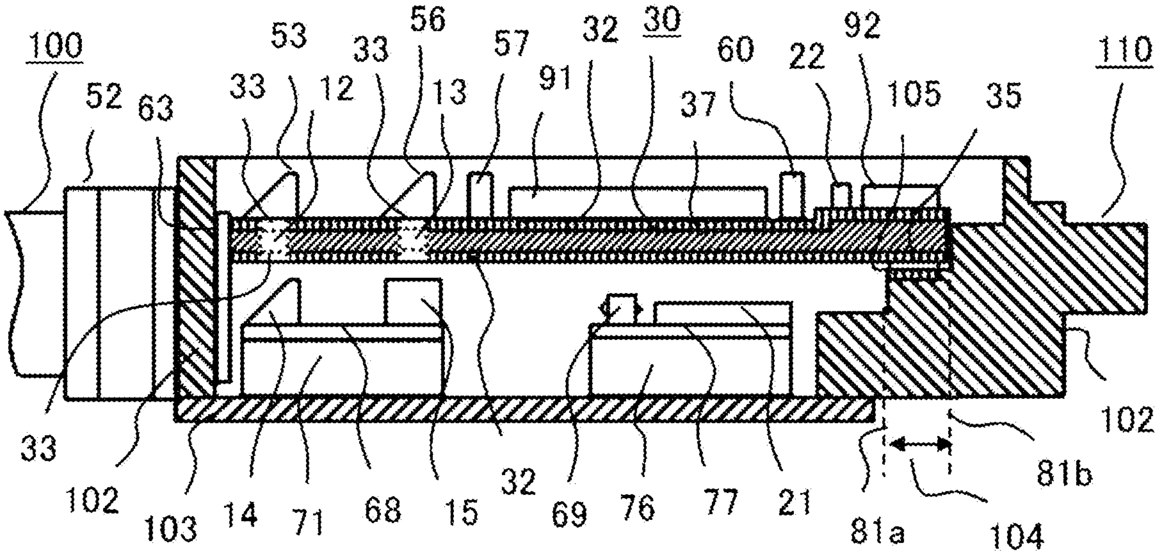
FIG. 15 is a diagram showing an optical semiconductor device according to Embodiment 3.

FIG. 15 is a diagram showing an optical semiconductor device according to Embodiment 3. The cross-sectional view shown in FIG. 15 corresponds to FIG. 3 of Embodiment 1. The optical semiconductor device 100 according to Embodiment 3 is different from the optical semiconductor device 100 according to Embodiment 1 in that a black plating layer 32 is formed on the surface of the receiving-unit-mounted substrate 30 facing the semiconductor laser 21 and on the surface on the opposite side. Differences from the optical semiconductor device 100 according to Embodiment 1 will be mainly described.

The receiving-unit-mounted substrate 30 according to Embodiment 3 includes the non-transmissive substrate 37, and the black plating layer 32 formed on the inner surface and the outer surface of the non-transmissive substrate 37. The black plating layer 32 is, for example, a plating layer of nickel (Ni) or chromium (Cr). In the black plating layer 32, the openings 33 are formed in portions thereof for the holes 12 and 13. The material of the non-transmissive substrate 37 is made of a substance that does not transmit light, for example, metal or ceramic. By passing through the opening 33 on the inner surface of the receiving-unit-mounted substrate 30, the hole 12, and the opening 33 on the outer surface of the receiving-unit-mounted substrate 30, the receiving light 24 is input from the transmitting unit 11 to the receiving unit 10. By passing through the opening 33 on the inner surface of the receiving-unit-mounted substrate 30, the hole 13, and the opening 33 on the outer surface of the receiving-unit-mounted substrate 30, the local oscillator light 26 is input from the transmitting unit 11 to the receiving unit 10. Note that, in FIG. 15, the electrode pattern 106 is omitted, and the holes 12 and 13 and the opening 33 are shown in white. The black plating layer 32 absorbs the laser light output from the semiconductor laser 21. Therefore, even when stray light is generated, the stray light is absorbed by the black plating layer 32 of the receiving-unit-mounted substrate 30, and thus it is possible to prevent the stray light from the transmitting side to the receiving side. In the optical semiconductor device 100 according to Embodiment 3, since the black plating layer 32 is formed on the surface of the receiving-unit-mounted substrate 30 facing the semiconductor laser 21 and on the surface on the opposite side, the effect of preventing electrical noise from the side of the transmitting unit 11 to the side of the receiving unit 10 can be enhanced as compared with the receiving-unit-mounted substrate 30 of a ceramic substrate.

Since the optical semiconductor device 100 according to Embodiment 3 has the same structure as the optical semiconductor device 100 according to Embodiment 1 except that the black plating layer 32 is formed on the surface of the receiving-unit-mounted substrate 30 facing the semiconductor laser 21 and on the surface on the opposite side, the optical semiconductor device 100 can prevent the stray light from the transmitting side to the receiving side while being compact even when the digital coherent optical communication is performed, as with the optical semiconductor device 100 according to Embodiment 1. In the optical semiconductor device 100 of Embodiment 3, since the black plating layer 32 of the receiving-unit-mounted substrate 30 absorbs the stray light, the stray light does not leak to the receiving unit 10 on the side opposite to the transmitting unit 11 with the receiving-unit-mounted substrate 30 interposed therebetween, and deterioration of the optical characteristics of the receiving light 24 can be prevented, as with the optical semiconductor device 100 of Embodiment 1.

Although FIG. 15 shows an example in which the black plating layer 32 is formed on the surface of the receiving-unit-mounted substrate 30 facing the semiconductor laser 21 and on the surface on the opposite side, the black plating layer 32 should be formed at least on the surface of the receiving-unit-mounted substrate 30 facing the semiconductor laser 21. The optical semiconductor device 100 according to Embodiment 3 including the receiving-unit-mounted substrate 30 in which the black plating layer 32 is formed on the inner surface, that is, the surface facing the semiconductor laser 21, also achieves the same effect as the optical semiconductor device 100 according to Embodiment 3 including the receiving-unit-mounted substrate 30 in which the black plating layer 32 is formed on the inner surface and the outer surface.

Embodiment 4

Figure 16:
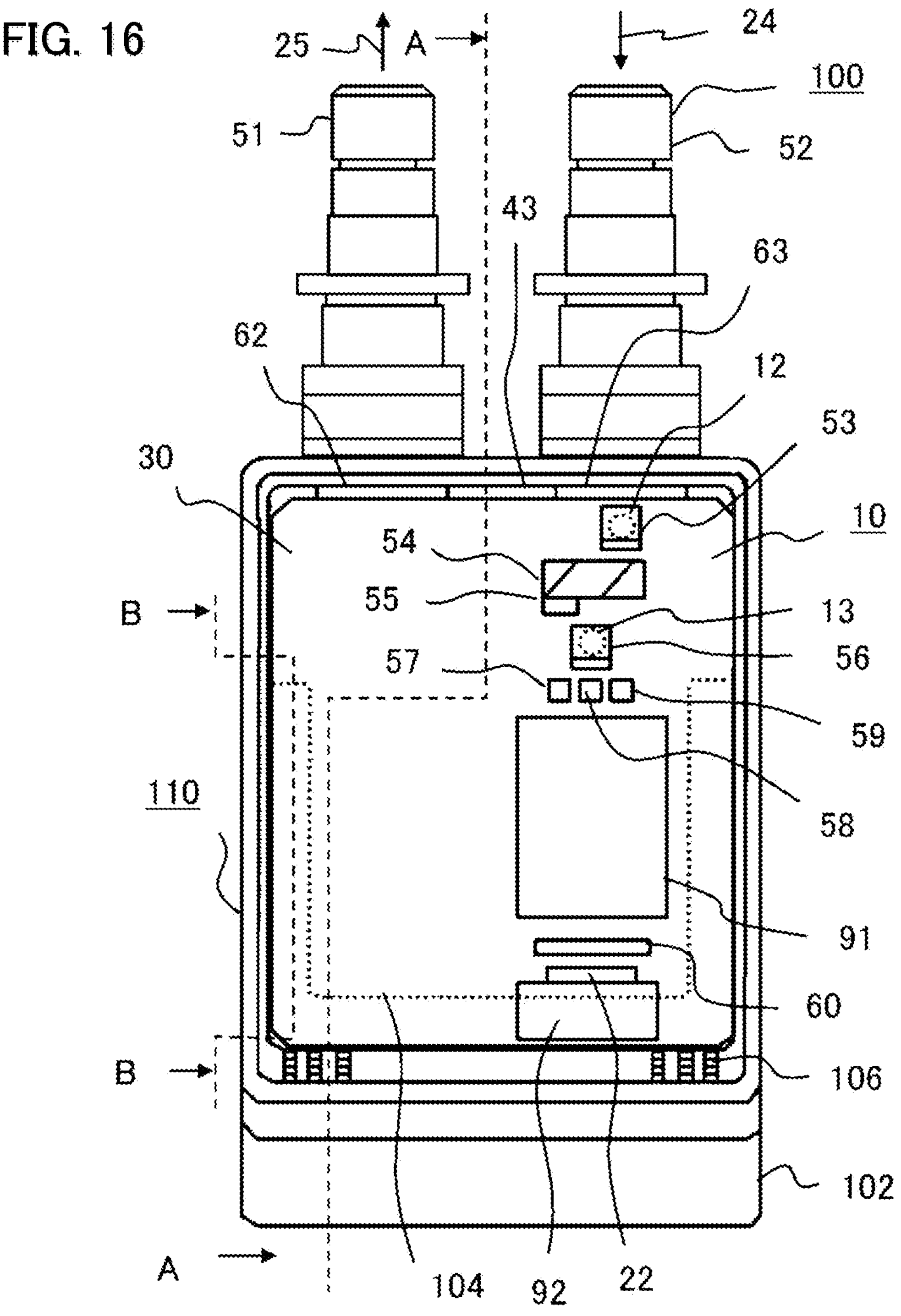
FIG. 16 is a diagram showing an optical semiconductor device according to Embodiment 4.
Figure 17:
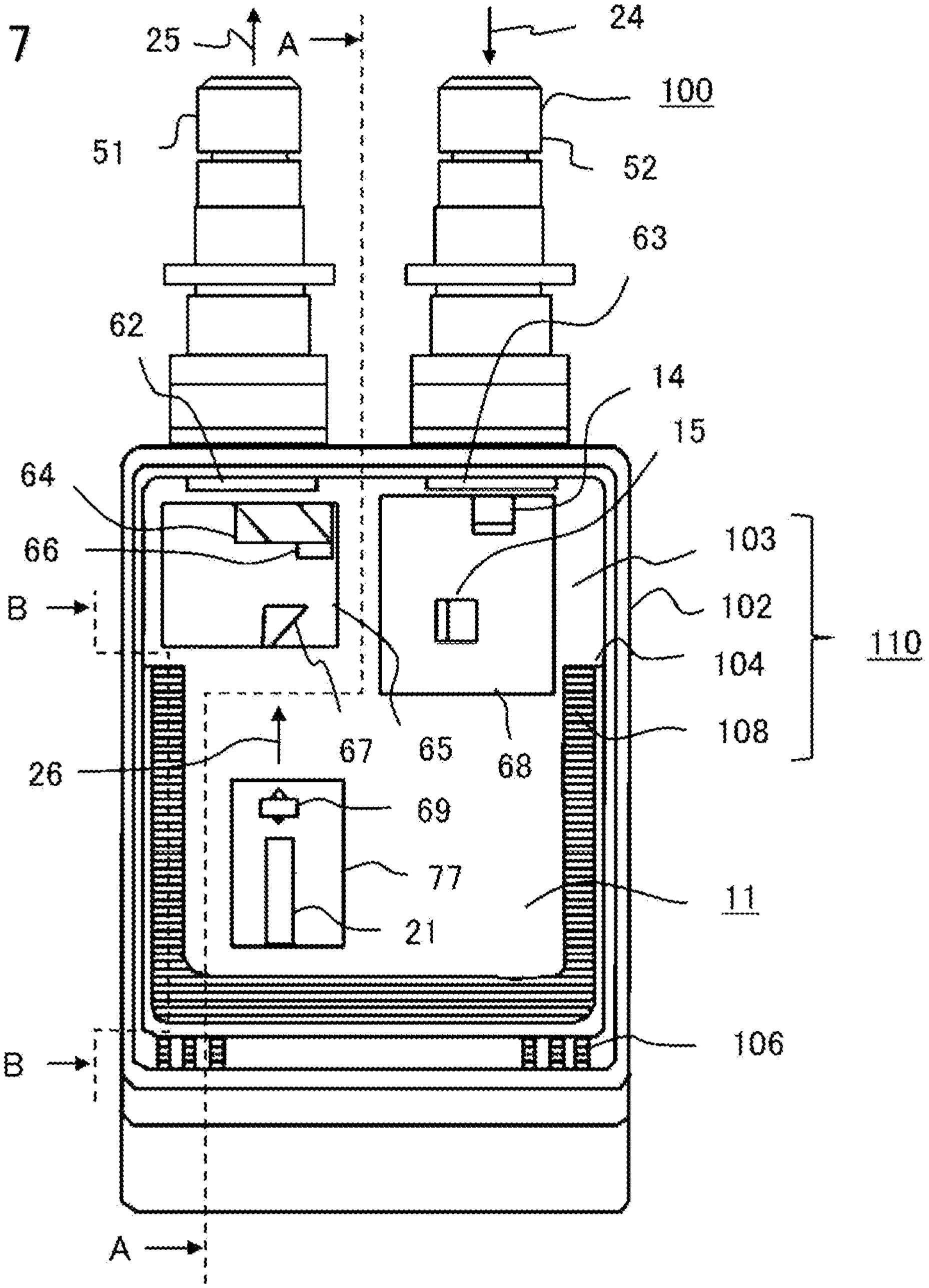
FIG. 17 is a diagram showing a bottom side of a package in the optical semiconductor device according to Embodiment 4.
Figure 18:
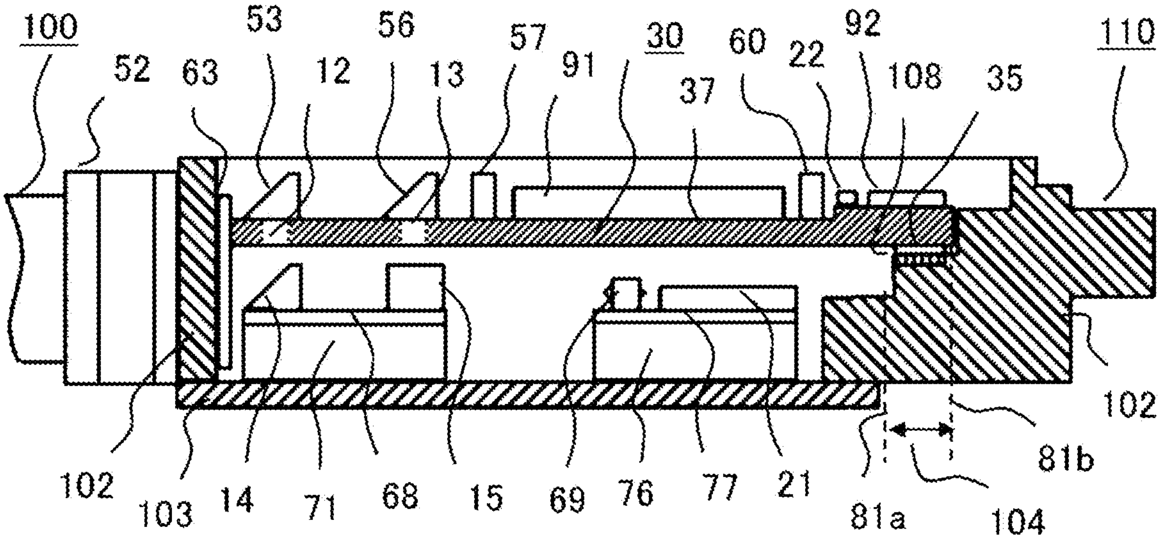
FIG. 18 is a cross-sectional view taken along the broken line indicated by A-A in FIG. 16.
Figure 19:
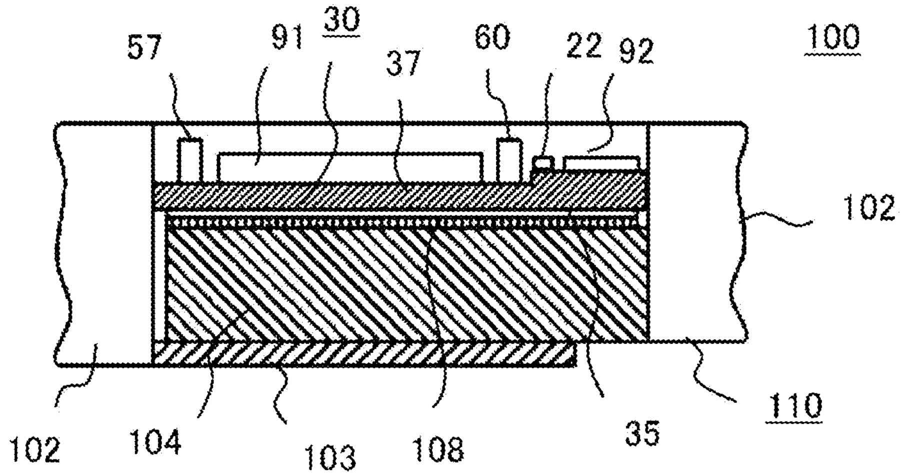
FIG. 19 is a cross-sectional view taken along the broken line indicated by B-B in FIG. 16.
Figure 20:
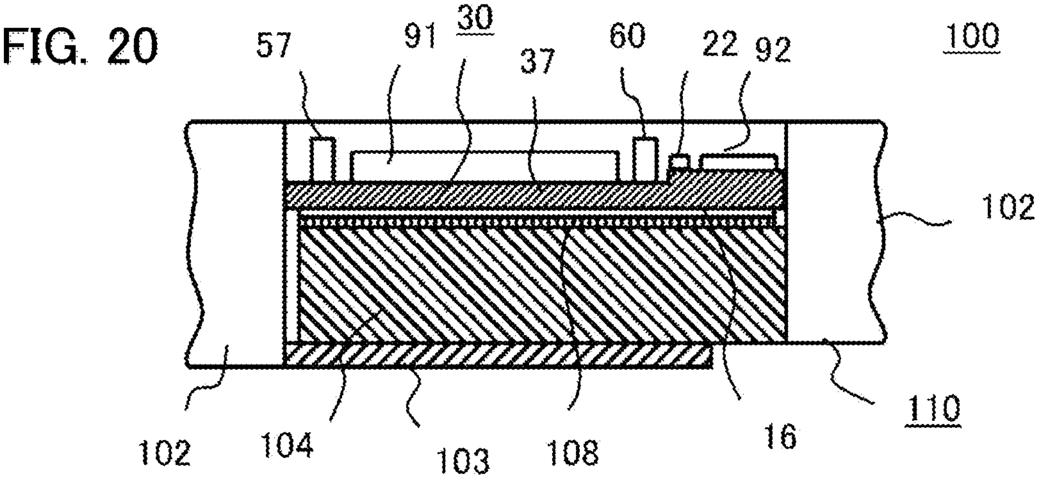
FIG. 20 is a diagram showing an example of connection between a ground pattern and a receiving-unit-mounted substrate in FIG. 17.
Figure 21:
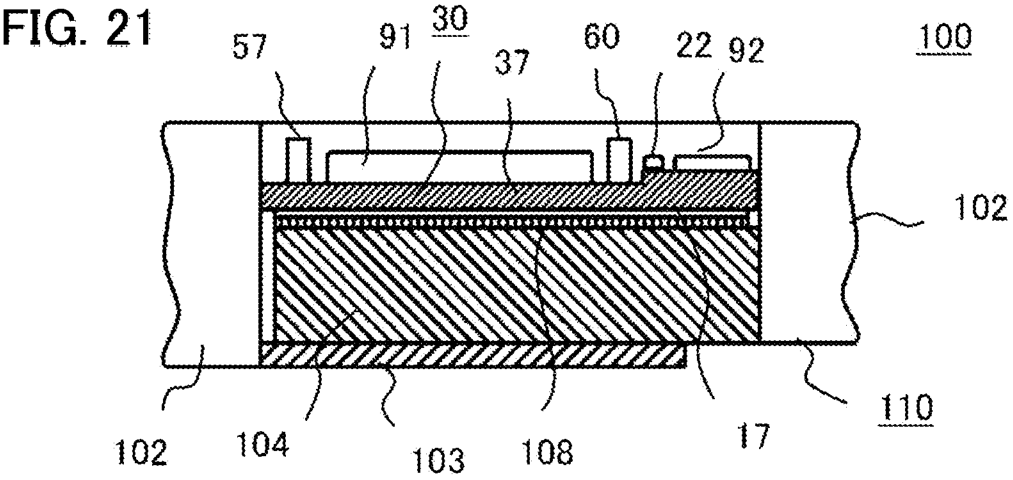
FIG. 21 is a diagram showing an example of connection between the ground pattern and the receiving-unit-mounted substrate in FIG. 17.

FIG. 16 is a diagram showing an optical semiconductor device according to Embodiment 4, and FIG. 17 is a diagram showing a bottom side of a package in the optical semiconductor device according to Embodiment 4. FIG. 18 is a cross-sectional view taken along a broken line indicated by A-A in FIG. 16, and FIG. 19 is a cross-sectional view taken along a broken line indicated by B-B in FIG. 16. FIG. 20 and FIG. 21 each are a diagram showing an example of connection between a ground pattern and the receiving-unit-mounted substrate in FIG. 17. Note that, in FIG. 18, the electrode pattern 106 is omitted, and the holes 12 and 13 are shown in white. The optical semiconductor device 100 according to Embodiment 4 is different from the optical semiconductor device 100 according to Embodiment 1 to Embodiment 3 in that a ground pattern 108 made of metal having ground potential of the optical semiconductor device is formed in the substrate disposition portion 104 of the package 110, and the receiving-unit-mounted substrate 30 is connected to the ground pattern 108 with a conductive connection member 35. Differences from the optical semiconductor device 100 according to Embodiment 1 will be mainly described.

In the optical semiconductor device 100 of Embodiment 4, it can also be said that the substrate connection pattern 105 made of metal in the optical semiconductor device 100 of Embodiment 1 is at the ground potential of the optical semiconductor device concerned. In the optical semiconductor device 100 according to Embodiment 4, since the receiving-unit-mounted substrate 30 is at the ground potential of the optical semiconductor device concerned, the effect of preventing electrical noise from the side of the transmitting unit 11 to the side of the receiving unit 10 can be enhanced as compared with the optical semiconductor device 100 according to Embodiment 1.

The conductive connection member 35 is, for example, solder or a conductive adhesive. FIG. 20 shows an example of connection between the ground pattern 108 of the package 110 and the receiving-unit-mounted substrate 30 in the case where the conductive connection member 35 is solder 16. FIG. 21 shows an example of connection between the ground pattern 108 of the package 110 and the receiving-unit-mounted substrate 30 in the case where the conductive connection member 35 is a conductive adhesive 17. Note that the conductive connection member 35 in the optical semiconductor device 100 according to Embodiment 1 to Embodiment 3 is also, for example, the solder or the conductive adhesive.

Since the optical semiconductor device 100 according to Embodiment 4 has the same structure as the optical semiconductor device 100 according to Embodiment 1 except that the receiving-unit-mounted substrate 30 is connected to the ground pattern 108 of the package 110 with the conductive connection member 35, even when the digital coherent optical communication is performed, it can prevent the stray light from the transmitting side to the receiving side while being compact, as with the optical semiconductor device 100 according to Embodiment 1. In the optical semiconductor device 100 according to Embodiment 4, as with the optical semiconductor device 100 according to Embodiment 1, the stray light is reflected by the receiving-unit-mounted substrate 30, so that the stray light does not leak to the receiving unit 10 on the side opposite to the transmitting unit 11 with the receiving-unit-mounted substrate 30 interposed therebetween, and deterioration of the optical characteristics of the receiving light 24 can be prevented.

Further, the optical semiconductor device 100 according to Embodiment 4 including the receiving-unit-mounted substrate 30 according to Embodiment 2 achieves the same effect as the optical semiconductor device 100 according to Embodiment 2. The optical semiconductor device 100 according to Embodiment 4 including the receiving-unit-mounted substrate 30 according to Embodiment 3 achieves the same effect as the optical semiconductor device 100 according to Embodiment 3.

Embodiment 5

Figure 22:
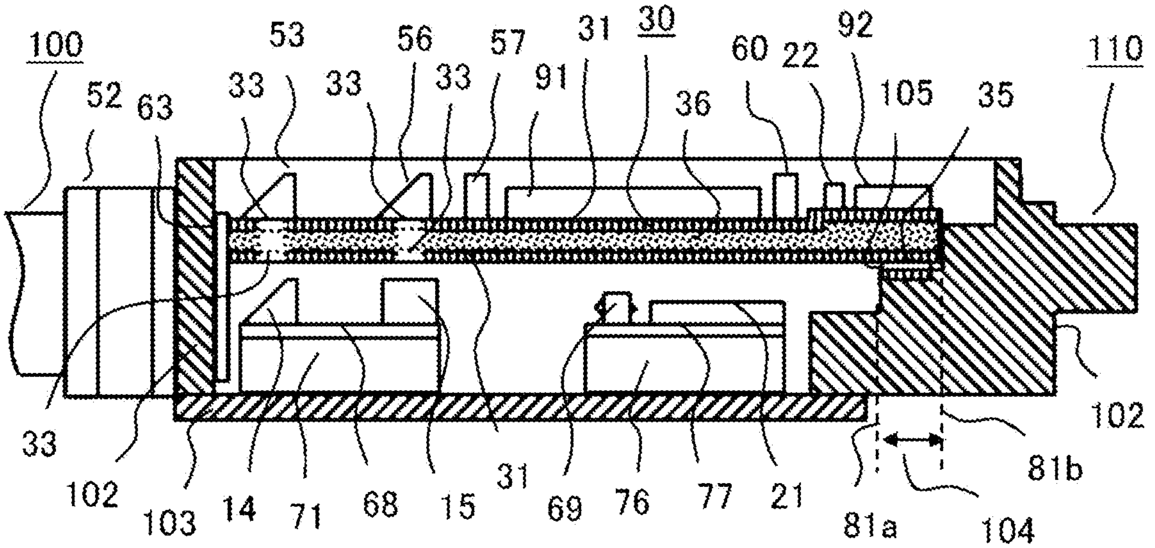
FIG. 22 is a diagram showing an optical semiconductor device according to Embodiment 5.
Figure 23:
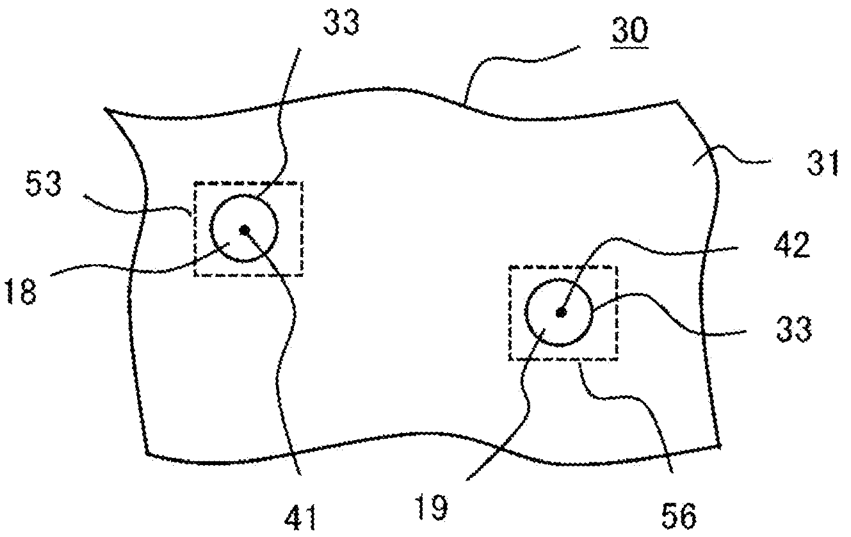
FIG. 23 is a diagram showing a light passing portion of the receiving-unit-mounted substrate of FIG. 22.
Figure 24:
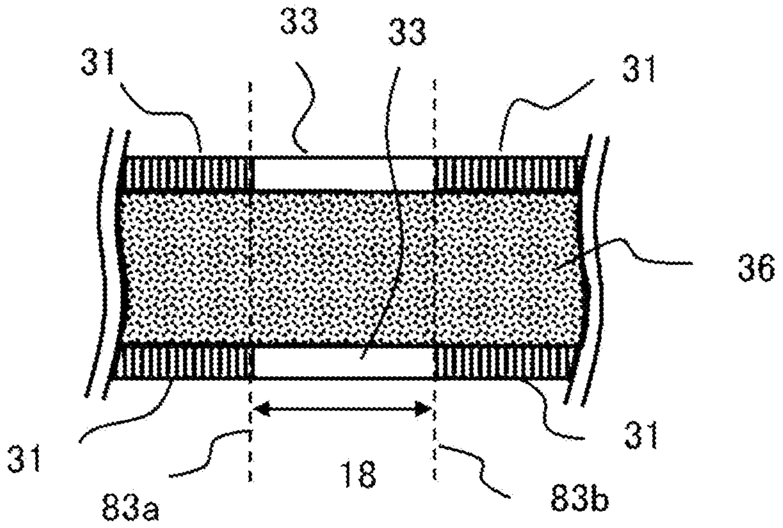
FIG. 24 is a diagram showing a cross-sectional view of the light transmitting portion of FIG. 23.

FIG. 22 is a diagram showing an optical semiconductor device according to Embodiment 5. FIG. 23 is a diagram showing a light passing portion of the receiving-unit-mounted substrate of FIG. 22, and FIG. 24 is a diagram showing a cross-sectional view of the light transmitting portion of FIG. 23. The cross-sectional view shown in FIG. 22 corresponds to FIG. 3 of Embodiment 1. The optical semiconductor device 100 according to Embodiment 5 is different from the optical semiconductor device 100 according to Embodiment 2 in that the base material of the receiving-unit-mounted substrate 30, which is the non-transmissive substrate that does not transmit the laser light, is a glass substrate 36. Differences from the optical semiconductor device 100 according to Embodiment 2 will be mainly described.

The glass substrate 36 has a high degree of flatness, which allows for more precise placement of components to be mounted. In addition, since the glass substrate 36 is easy to mold, it can be fabricated at a lower cost than a metal substrate or a ceramic substrate.

The receiving-unit-mounted substrate 30 according to Embodiment 5 includes the glass substrate 36 and the metal plating layer 31 formed on the inner surface and the outer surface of the glass substrate 36. The opening 33 is formed in a portion of the metal plating layer 31 in a light transmitting portion 18 of the glass substrate 36, which is the light passing portion through which the receiving light 24 passes, and in a portion of the metal plating layer 31 in a light transmitting portion 19 of the glass substrate 36, which is the light passing portion through which the local oscillator light 26 passes. FIG. 23 shows an example in which the opening 33 is circular, and FIG. 24 shows a cross-sectional view of the light transmitting portion 18 through which the receiving light 24 passes. The opening 33 is formed between a broken line 83*a* and a broken line 83*b*, and the area between the broken line 83*a* and the broken line 83*b* in the glass substrate 36 is the light transmitting portion 18. The light transmitting portion 18 is a portion of the glass substrate 36 exposed by the opening 33. The light transmitting portion 19 through which the local oscillator light 26 passes has the same structure as the light transmitting portion 18. Note that, in FIG. 22, the electrode pattern 106 is omitted, and the opening 33 and the light transmitting portion exposed by the opening 33 are shown in white.

By passing through the opening 33 on the inner surface of the receiving-unit-mounted substrate 30, the light transmitting portion 18, and the opening 33 on the outer surface of the receiving-unit-mounted substrate 30, the receiving light 24 is input from the transmitting unit 11 to the receiving unit 10. By passing through the opening 33 on the inner surface of the receiving-unit-mounted substrate 30, the light transmitting portion 19, and the opening 33 on the outer surface of the receiving-unit-mounted substrate 30, the local oscillator light 26 is input from the transmitting unit 11 to the receiving unit 10. In the optical semiconductor device 100 according to Embodiment 5, since the metal plating layer 31 is formed on the surface of the receiving-unit-mounted substrate 30 facing the semiconductor laser 21 and on the surface on the opposite side, the same effect as the semiconductor optical device 100 according to Embodiment 2 can be achieved. In the receiving-unit-mounted substrate 30, the black plating layer 32 may be formed instead of the metal plating layer 31. The receiving-unit-mounted substrate 30 according to Embodiment 5 including the black plating layer 32 formed on the inner surface and the outer surface of the glass substrate 36 has the same effect as the optical semiconductor device 100 according to Embodiment 3.

Although FIG. 22 shows an example in which the metal plating layer 31 is formed on the surface of the receiving-unit-mounted substrate 30 facing the semiconductor laser 21 and on the surface on the opposite side, the metal plating layer 31 should be formed at least on the surface of the receiving-unit-mounted substrate 30 facing the semiconductor laser 21. The optical semiconductor device 100 according to Embodiment 5 including the receiving-unit-mounted substrate 30 in which the metal plating layer 31 is formed on the inner surface, that is, the surface facing the semiconductor laser 21, also achieves the same effect as the optical semiconductor device 100 according to Embodiment 5 including the receiving-unit-mounted substrate 30 in which the metal plating layer 31 is formed on the inner surface and the outer surface.

As described above, the optical semiconductor device 100 according to Embodiment 5 is an optical semiconductor device in which the semiconductor laser 21 that outputs the laser light and the semiconductor light receiving element 22 that receives the signal light (receiving light 24) from the outside are mounted on the package 110 and which performs the digital coherent optical communication with the outside. The optical semiconductor device 100 according to Embodiment 5 includes the semiconductor laser 21 mounted on the bottom portion 103 of the package 110, the receiving unit 10 that receives the signal light (receiving light 24) from the outside using the local oscillator light 26, which is the laser light output from the semiconductor laser 21, and the receiving-unit-mounted substrate 30 on which the receiving unit 10 including the semiconductor light receiving element 22 is mounted. The receiving unit 10 is disposed on the surface opposite to the surface facing the semiconductor laser 21. The receiving-unit-mounted substrate 30 is the non-transmissive substrate that does not transmit the laser light, has the light passing portion (light transmitting portion 19) through which the local oscillator light 26 output by the semiconductor laser 21 passes, and covers the bottom portion 103 surrounded by the outer peripheral portion 102 of the package 110 without the gap 43 or with the gap 43, relative to the outer peripheral portion 102. When the receiving-unit-mounted substrate 30 covers the bottom portion 103 surrounded by the outer peripheral portion 102 of the package 110 with the gap 43 relative to the outer peripheral portion 102, the length (gap length d) of the gap 43 between the outer peripheral portion 102 of the package 110 and the receiving-unit-mounted substrate 30 is equal to or less than the thickness (substrate thickness h) of the receiving-unit-mounted substrate 30. Furthermore, the receiving-unit-mounted substrate 30, which is the non-transmissive substrate, has a base material that is the glass substrate 36 that transmits the laser light. In the receiving-unit-mounted substrate 30, the metal plating layer having the opening 33 through which the local oscillator light 26 output by the semiconductor laser 21 passes is formed on the surface facing the semiconductor laser 21 and on the surface on the opposite side and. The light passing portion (light transmitting portion 19) through which the local light source light passes is the portion of the glass substrate exposed by the opening 33. In the optical semiconductor device 100 according to Embodiment 5 with the configuration, since the semiconductor laser 21 that outputs the laser light is mounted on the bottom portion 103 of the package 110, and the receiving unit 10 is mounted on the side opposite to the semiconductor laser 21 in the receiving-unit-mounted substrate 30, the receiving-unit-mounted substrate 30 covering the bottom portion 103 surrounded by the outer peripheral portion 102 of the package 110 without the gap 43 or with the gap 43, relative to the outer peripheral portion 102. Therefore, even in the case of the digital coherent optical communication, the stray light from the transmitting side to the receiving side can be prevented while a compact size is maintained.

Although the optical semiconductor device 100 in the case of performing the digital coherent optical communication has been described in Embodiment 1 to Embodiment 5, the three dimensional arrangement structure in which the transmitting unit 11 including the semiconductor laser 21 that outputs the laser light and the receiving unit 10 including the semiconductor light receiving element 22 that receives the receiving light 24 being the signal light from the outside are disposed with the receiving-unit-mounted substrate 30 interposed therebetween can also be applied to the optical semiconductor device 100 in a case of performing optical communication different from the digital coherent optical communication.

Note that, although various exemplary embodiments and examples are described in the present application, various features, aspects, and functions described in one or more embodiments are not inherent in a particular embodiment and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

10: receiving unit, 13: hole (light passing portion), 19: light transmitting portion (light passing portion), 21: semiconductor laser, 22: semiconductor light receiving element, 24: receiving light, 26: local oscillator light, 30: receiving-unit-mounted substrate, 31: metal plating layer, 32: black plating layer, 33: opening, 35: conductive connection member, 36: glass substrate, 37: non-transmissive substrate, 38: recess, 43: gap, 100: optical semiconductor device, 110: package, 102: outer peripheral portion, 103: bottom portion, 104: substrate disposition portion, 105: substrate connection pattern, 108: ground pattern, d: gap length, h: substrate thickness

The invention claimed is:

1. An optical semiconductor device in which a semiconductor laser that outputs laser light and a semiconductor light receiving element that receives signal light from an outside are mounted on a package, and which performs digital coherent optical communication with an outside, the optical semiconductor device comprising:

the semiconductor laser mounted on a bottom portion of the package;

a receiving unit to receive the signal light from an outside by using local oscillator light that is the laser light output from the semiconductor laser; and a receiving-unit-mounted substrate on which the receiving unit including the semiconductor light receiving element is mounted, wherein the receiving unit is disposed on a surface thereof opposite to a surface thereof facing the semiconductor laser, and the receiving-unit-mounted substrate is a non-transmissive substrate that does not transmit the laser light, includes a light passing portion through which the local oscillator light output by the semiconductor laser passes, and covers the bottom portion surrounded by an outer peripheral portion of the package without a gap or with a gap, relative to the outer peripheral portion, and when the receiving-unit-mounted substrate covers the bottom portion surrounded by the outer peripheral portion of the package with the gap relative to the outer peripheral portion, a gap length between the outer peripheral portion of the package and the receiving-unit-mounted substrate is equal to or less than a thickness of the receiving-unit-mounted substrate.

2. The optical semiconductor device according to claim 1, wherein the receiving-unit-mounted substrate is a metal substrate.

3. The optical semiconductor device according to claim 1, wherein a metal plating layer is formed on the surface of the receiving-unit-mounted substrate facing the semiconductor laser.

4. The optical semiconductor device according to claim 3, wherein the metal plating layer is formed on the surface of the receiving-unit-mounted substrate opposite to the surface thereof facing the semiconductor laser.

5. The optical semiconductor device according to claim 1, wherein a black plating layer that absorbs the laser light is formed on the surface of the receiving-unit-mounted substrate facing the semiconductor laser.

6. The optical semiconductor device according to claim 5, wherein the black plating layer that absorbs the laser light is formed on the surface of the receiving-unit-mounted substrate opposite to the surface thereof facing the semiconductor laser.

7. The optical semiconductor device according to claim 1, wherein the receiving-unit-mounted substrate has a plurality of recesses formed on the surface thereof facing the semiconductor laser, the recesses multiply reflecting light having the same frequency as that of the local oscillator light.

8. The optical semiconductor device according to claim 1, wherein the light passing portion in the receiving-unit-mounted substrate through which the local oscillator light passes is a hole penetrating the receiving-unit-mounted substrate.

9. The optical semiconductor device according to claim 1, wherein the receiving-unit-mounted substrate is such that a base material is a glass substrate that transmits the laser light, a metal plating layer having an opening through which the local oscillator light output from the semiconductor laser passes is formed on the surface facing the semiconductor laser and on the surface on the opposite side, and the light passing portion through which the local oscillator light passes is a portion of the glass substrate exposed by the opening.

10. The optical semiconductor device according to claim 1, wherein the package includes a substrate disposition portion that is provided to extend inside the outer peripheral portion and in which the receiving-unit-mounted substrate is disposed, and a substrate connection pattern made of metal that is formed on the substrate disposition portion and is connected to the receiving-unit-mounted substrate with a conductive connection member.

11. The optical semiconductor device according to claim 1, wherein the package includes a substrate disposition portion that is provided to extend inside the outer peripheral portion and in which the receiving-unit-mounted substrate is disposed, and a ground pattern made of metal that is formed on the substrate disposition portion and is connected to the receiving-unit-mounted substrate with a conductive connection member, and the ground pattern is at ground potential of the optical semiconductor device.

12. The optical semiconductor device according to claim 2, wherein the receiving-unit-mounted substrate has a plurality of recesses formed on the surface thereof facing the semiconductor laser, the recesses multiply reflecting light having the same frequency as that of the local oscillator light.

13. The optical semiconductor device according to claim 2, wherein the light passing portion in the receiving-unit-mounted substrate through which the local oscillator light passes is a hole penetrating the receiving-unit-mounted substrate.

14. The optical semiconductor device according to claim 3, wherein the light passing portion in the receiving-unit-mounted substrate through which the local oscillator light passes is a hole penetrating the receiving-unit-mounted substrate.

15. The optical semiconductor device according to claim 4, wherein the light passing portion in the receiving-unit-mounted substrate through which the local oscillator light passes is a hole penetrating the receiving-unit-mounted substrate.

16. The optical semiconductor device according to claim 5, wherein the light passing portion in the receiving-unit-mounted substrate through which the local oscillator light passes is a hole penetrating the receiving-unit-mounted substrate.

17. The optical semiconductor device according to claim 6, wherein the light passing portion in the receiving-unit-mounted substrate through which the local oscillator light passes is a hole penetrating the receiving-unit-mounted substrate.

18. The optical semiconductor device according to claim 7, wherein the light passing portion in the receiving-unit-mounted substrate through which the local oscillator light passes is a hole penetrating the receiving-unit-mounted substrate.

19. The optical semiconductor device according to claim 2, wherein the package includes a substrate disposition portion that is provided to extend inside the outer peripheral portion and in which the receiving-unit-mounted substrate is disposed, and a substrate connection pattern made of metal that is formed on the substrate disposition portion and is connected to the receiving-unit-mounted substrate with a conductive connection member.

20. The optical semiconductor device according to a claim 2, wherein the package includes a substrate disposition portion that is provided to extend inside the outer peripheral portion and in which the receiving-unit-mounted substrate is disposed, and a ground pattern made of metal that is formed on the substrate disposition portion and is connected to the receiving-unit-mounted substrate with a conductive connection member, and the ground pattern is at ground potential of the optical semiconductor device.

* * * * *